United States Patent
Shi et al.

(10) Patent No.: US 6,899,960 B2
(45) Date of Patent: May 31, 2005

(54) MICROELECTRONIC OR OPTOELECTRONIC PACKAGE HAVING A POLYBENZOXAZINE-BASED FILM AS AN UNDERFILL MATERIAL

(75) Inventors: Song-Hua Shi, Phoenix, AZ (US); Lejun Wang, Chandler, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/104,830

(22) Filed: Mar. 22, 2002

(65) Prior Publication Data

US 2003/0190477 A1 Oct. 9, 2003

(51) Int. Cl.[7] .............................................. H01L 23/29
(52) U.S. Cl. ....................... 428/620; 174/258; 174/259; 257/788; 257/790
(58) Field of Search ................. 257/788, 790; 174/258, 259; 428/620

(56) References Cited

U.S. PATENT DOCUMENTS

| | | | |
|---|---|---|---|
| 4,619,500 A | 10/1986 | Ahne et al. ................. 350/341 |
| 5,543,516 A * | 8/1996 | Ishida .......................... 544/69 |
| 5,900,447 A * | 5/1999 | Ishida .......................... 524/404 |
| 6,143,467 A | 11/2000 | Hsu et al. ................. 430/270.1 |
| 6,225,440 B1 * | 5/2001 | Ishida .......................... 528/403 |
| 6,376,080 B1 | 4/2002 | Gallo .......................... 428/413 |
| 6,727,594 B2 * | 4/2004 | Wang et al. ................. 257/778 |
| 2003/0052414 A1 | 3/2003 | Cowens et al. ............. 257/778 |
| 2003/0080437 A1 * | 5/2003 | Gonzalez et al. ........... 257/778 |
| 2003/0109080 A1 * | 6/2003 | Dias ........................... 438/108 |
| 2003/0122241 A1 * | 7/2003 | Wang et al. ................. 257/687 |
| 2003/0125551 A1 * | 7/2003 | Dershem et al. ............. 544/69 |

* cited by examiner

Primary Examiner—Robert Sellers
(74) Attorney, Agent, or Firm—Blakely, Sokoloff, Taylor & Zafman LLP

(57) ABSTRACT

Microelectronic and optoelectronic packaging embodiments are described with underfill materials including polybenzoxazine, having the general formula:

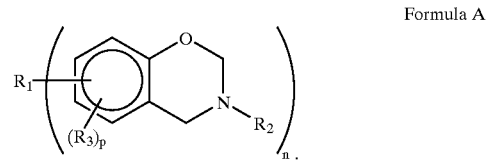

Formula A

19 Claims, 2 Drawing Sheets

MICROELECTRONIC OR OPTOELECTRONIC PACKAGE HAVING A POLYBENZOXAZINE-BASED FILM AS AN UNDERFILL MATERIAL

BACKGROUND OF THE INVENTION

1). Field of the Invention

This invention relates to microelectronic and optoelectronic packages and, more specifically, to an underfill material in such packages.

2). Discussion of Related Art

A microelectronic or an optoelectronic package usually includes either a microelectronic semiconductor die or an optoelectronic die mounted to a package substrate. The package substrate provides rigidity to the overall package, and often also provides electronic interconnect between the die and another device. An underfill material is introduced between the die and the package substrate.

The semiconductor die, for example, may have conductive members on a lower surface thereof, and are positioned on top of an upper surface of the package substrate. The conductive members provide electric communication between the semiconductor die and the package substrate. The conductive members also mount the conductor die to the package substrate. The conductive members are, however, relatively fragile. Differences in coefficients of thermal expansion (CTE) between the semiconductor die and the package substrate cause relative shrinkage or expansion between the semiconductor die and the package substrate. The underfill material serves to reduce stresses on the conductive members due to such relative expansion or contraction.

A filler material is usually included in the underfill material. Filler loading is usually required to reduce shrinkage during curing, to control CTE, and to control moisture uptake. Filler loading tremendously increases the viscosity of the film at bonding temperature. The increased viscosity tremendously increases the bonding force per bump and reduces the wetting properties of melted film to all contact surfaces. The increase of bonding force per bump often cracks the chip during chip placement, and poor wetting properties of melted film adversely affect the joint integrity and introduces voids that shorten the joint fatigue life.

BRIEF DESCRIPTION OF THE DRAWINGS

The invention is described by way of examples with reference to the accompanying drawings, wherein.

DETAILED DESCRIPTION OF THE INVENTION

Figure 1A:
FIGS. 1a–e are cross-sectional side views of polybenzoxazine-based films according to different embodiments of the invention.

Microelectronic and optoelectronic packaging embodiments are described with underfill materials including polybenzoxazine, having the general formula:

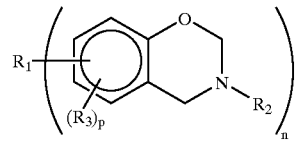

Formula A

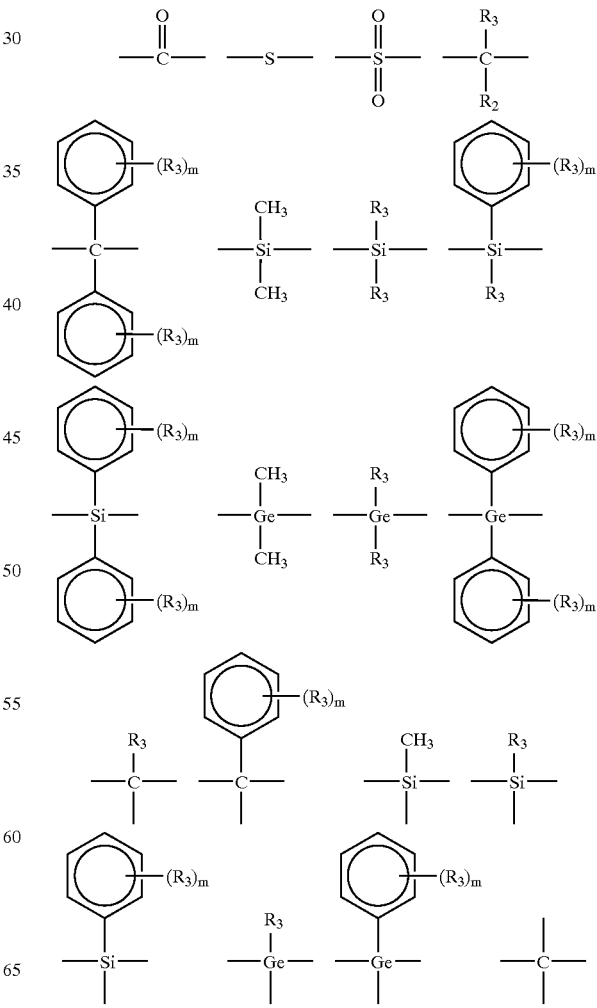

wherein n can be any integer from 1 to 20 and is preferably an integer from 1 to 4 and is most preferably 1 or 2, and $R_1$ can be hydrogen, one or more groups selected from hydroxyls, one or more linear or branched alkyls of 1 to 80 and more preferably 1 to 10 carbon atoms, aromatics, alkyl substituted aromatics, aromatic substituted alkyls of 6 or 20 carbon atoms, mono or poly fluorine substituted alkyls of 1 to 20 carbon atoms, a mono or poly fluorine substituted compound having at least 1 aromatic ring and 6 to 20 carbon atoms, and phenolic compounds of 6 to 20 carbon atoms (for the purpose of this specification phenolic compounds may have more than one hydroxyl group as defined in chemical dictionaries) including poly phenolic compounds having on average 6 to 20 carbon atoms per phenol group. When n is 2, 3 or 4, $R_1$ can be selected from the connecting groups below:

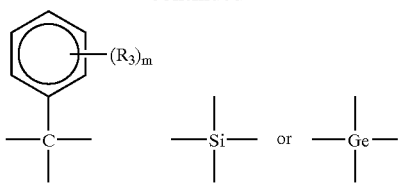

Depending on whether phenolic or phenoxy repeat units are desired in the polybenzoxazine, it may be desirable that $R_1$ be ortho, meta, or para to the oxygen atom of the benzoxazine monomer of Formula A. Further, $R_2$ may be an alkyl of 1 to 40 carbon atoms, an aromatic, an alkyl substituted aromatic or aromatic substituted alkyl of 6 to 40 carbon atoms, mono or poly fluorine substituted alkyl of 1 to 20 carbon atoms, a mono or poly fluorine substituted compound having at least one aromatic ring and 6 to 20 carbon atoms or an amine of 1 to 40 carbon atoms including polyamines and aromatic, alkyl substituted aromatic, or aromatics substituted alkyls having 6 to 40 carbon atoms. Furthermore, each benzene ring, as shown by $(R_3)$, where p is an integer from 0 to 3 and $R_3$ is as defined later, can have more than one substituent of the same structure or a mixture of the $R_3$ structures.

The variable m can be an integer from 0 to 5 and $R_3$ can be H or $R_2$. Preferably $R_3$ is not the amine or polyamine components of $R_2$. Preferably $R_3$ is an alkyl of 1 to 9 carbon atoms such as $CH_3$, $C_2H_5$, $C_3H_7$, or $C_4H_9$, or a mono or poly fluorinated alkyl of 1 to 9 carbon atoms such as $CF_3$, $C_2F_5$, or $C_3F_7$. These $R_1$ compounds are well known to those familiar with phenolic compounds. Generally $R_1$ can be any of the known connecting groups than interconnect two or more phenols. Known connecting groups refers to those which are present in commercially available phenols, are in experimentally available phenols, and phenols whose synthesis are described in the published literature. Examples of such phenols include:

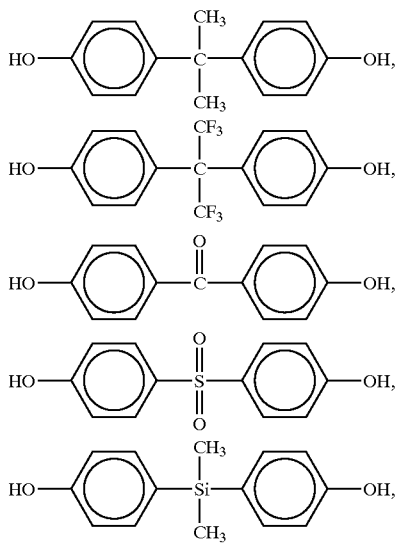

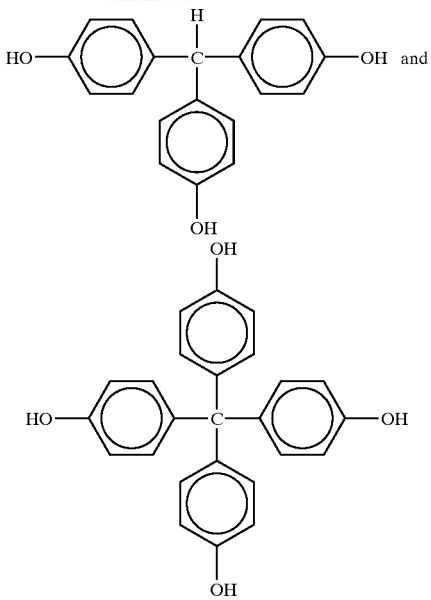

As the cationically initiated ring opening polymerization of monofunctional benzoxazines generally results in linear polymers, it is desirable that at least 25 mole percent, more desirably at least 50 mole percent and preferably at least 75 mole percent or 90 mole percent of the $R_1$ groups are not an additional hydroxyl groups or a phenolic or polyphenolic compound and n in Formula A is 1. Also desirably at least 25 mole percent, more desirably at least 50 percent, still more desirably at least 75 or 90 mole percent of the $R_2$ groups are neither polyamines nor include additional benzoxazine compounds. These limitations are desirable for thermoplastic polybenzoxazines, but it is understood that if thermoset polybenzoxazines are desired, the amount of difunctional or polyfunctional benzoxazine monomers (those where n is 2 to 20 or $R_2$ is a polyamine or includes additional benzoxazine rings) could be higher. When high molecular weight thermoplastic polybenzoxazines are desired, desirably the number average molecular weight of the polybenzoxazine is at least 5,000 and more desirably at least 10,000.

As is well known, benzoxazine monomers are made from the reaction of three reactants, aldehydes, phenols, and primary amines by procedures using a solvent or known as solventless systems. U.S. Pat. No. 5,543,516 sets forth a generally solventless method of forming benzoxazine monomers. An article by Ning and Ishida in Journal of Polymer Science, Chemistry Edition, vol. 32, page 1121 (1994) sets forth a procedure using a solvent which can be used to prepare benzoxazine monomers. The procedure using solvents is generally common to the literature of benzoxazine monomers.

The preferred phenolic compounds are phenol or cresol, but can include diphenols (e.g., bisphenol-A), triphenols, etc., e.g., polyphenols, wherein each phenolic group in the phenolic compound has on average about 6 to about 20 carbon atoms per phenol group. The use of phenols with two or more hydroxyl groups reactive in forming benzoxazines may result in branched and/or crosslinked products. The groups connecting the phenolic groups into a phenol can be branch points or connecting groups in the polybenzoxazine.

The aldehydes used to form the benzoxazine can be any aldehyde, but preferably the aldehydes are those having from about 1 to about 10 carbon atoms, with formaldehyde being highly preferred. The amine used to form the benzoxazine can be an aromatic amine, an aliphatic amine, an alkyl substituted aromatic, or an aromatic substituted alkyl amine. The amine can also be a polyamine, although the use of polyamines will, under some circumstances, yield polyfunctional benzoxazine monomers. Polyfunctional benzoxazine monomers are more likely to result in branched and/or crosslinked polybenzoxazines than monofunctional benzoxazines, which would be anticipated to yield thermoplastic polybenzoxazines.

The amines generally have from about 1 to about 40 carbon atoms unless they include aromatic rings, and then they may have from about 6 to about 40 carbon atoms. The amine of di or polyfunctional may also serve as a branch point to connect one polybenzoxazine to another.

In the past, thermal polymerization has been the preferred method for polymerizing benzoxazine monomers. The temperature to induce thermal polymerization is typically varied from about 150 to about 300° C. The polymerization is typically done in bulk, but could be done from solution or otherwise. Catalysts, such as carboxylic acids, have been known to slightly lower the polymerization temperature or accelerate the polymerization rate at the same temperature.

Cationic polymerization initiators described in this invention have been found to result in polymerization of benzoxazine monomers at temperatures as low as cryogenic temperatures. Preferred temperatures are from about −100° C. to about 250° C., and most preferably between about −60 and 150° C. for ease of handling the reactants and products. Some of the cationic initiators, e.g., $PCl_5$, form repeating units from the benzoxazine monomers, that include a salt of the amine. These repeating units have better solubility in polar solvents, e.g., water, than similar repeating units without the amine salt. The initiators of the current invention can be used either in the benzoxazine melt or in the presence of solvent, allowing the solvent content to be from 0% to nearly 100%. Many solvents can be used in cationic polymerizations, and their selection is known by those skilled in the art of cationic polymerization.

The polymers from the cationically initiated polymerization of benzoxazine are useful as molded articles with good thermal stability and/or flame resistance, such as molded circuit boards, flame resistant laminates, or other molded articles, and is a source of precursor to high temperature resistant chars. The common uses for high temperature resistant chars include aircraft brake discs, equipment for sintering reactions, and heat shields or heat shielding material. The polymers which include repeating units having amine salts can be used in applications for partially or fully water soluble polymers such as viscosity control agents.

Generally, given optimal reaction conditions, cationic initiators can polymerize benzoxazine monomers or oligomers. These include $H_2SO_4$, $HClO_4$, $BF_3$, $AlCl_3$, t-BuCl/ $Et_2AlCl$, $Cl_2/BCl_3$, $AlBr_3$, $AlBr3.TiCl_4$, $I_2$, $SnCl_4$, $WCl_6$, $AlEt_2Cl$, $PF_5$, $VCl_4$, $AlEtCl_2$, and $BF_3Et_2O$. Preferred initiators include $PCl_5$, $PCl_3$, $POCl_3$, $TiCl_5$, $SbCl_5$, $(C_6H_5)_3C^+$ $(SbCl_6)^-$, or metallophorphyrin compounds such as aluminum phthalocyanine chloride, which are all known to result in similar polymers from cationically initiated polymerization of unsaturated monomers. Methyl iodide (a covalent initiator), butyl lithium (an ionic initiator), and benzoyl peroxide (a radical initiator) were not effective at polymerizing experimental benzoxazine monomers.

Methyl tosylate, methyl triflate, and triflic acid appear to cationically polymerize the experimental benzoxazine monomers, although the polymers did not precipitate from solution. Typically, each initiator initiates a polymer with from about 3 to about 1,000 to 3,000 repeat units, so the amount of initiator needed on a mole percent basis relative to the monomer is small. However, an additional initiator is needed to compensate for loss due to adventitious moisture and other reactants that deactivate cations, that may be present in the monomers solvents, etc. Desirably about 0.001 to about 50 mole percent initiator based upon the monomer and more desirably from about 0.01 to about 10 mole percent initiator is used for these cationically initiated polymerizations.

EXAMPLES

Several factors have been found to change the structure of the benzoxazine polymers prepared by cationic polymerization. These factors include polymerization temperature, the particular cationic initiator, and competing reactivity between the ortho-carbon of the benzene ring and the basic nitrogen atom of the oxazine ring.

For example, the following results were obtained with $PCl_5$ as the initiator at −60° C. and 40° C.:

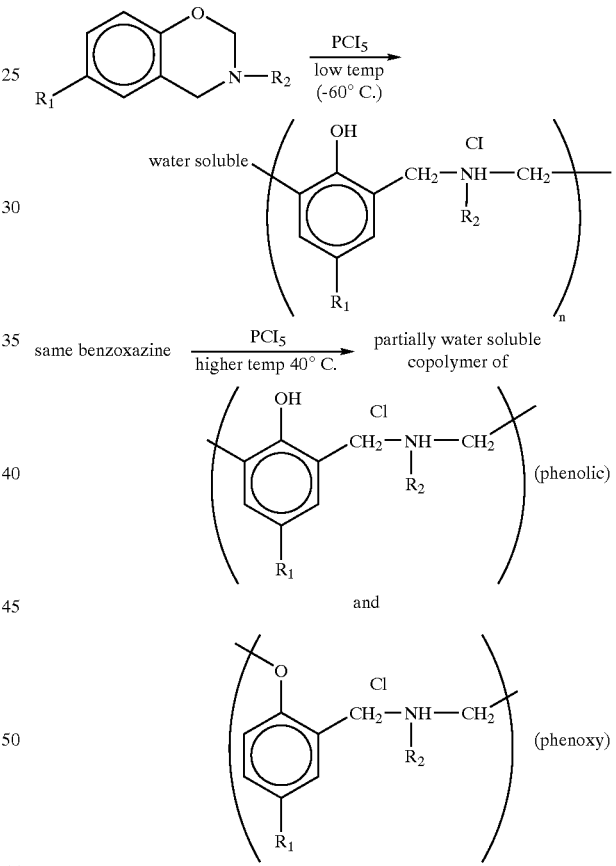

Thus, the formation of a phenolic repeating unit having an amine salt therein occurs preferentially to this kind of monomer (monoparasubstituted benzene ring other than the two sites occupied by the oxazine ring) at low temperatures (e.g., −60° C.) with a $PCl_5$ initiator. A phenoxy repeating unit occurs more frequently at 40° C. than at −60° C., but still is not the exclusive repeating unit. The amine salt form of the phenolic repeating unit causes an increased water solubility. Further, at −60° C. the availability or reactivity of an ortho CH position also affects the relative ratio of phenolic to phenoxy repeat units. Steric hindrance around the ortho CH position or a substituent in the ortho Cl position favors a phenoxy structure from the benzoxazine, while the absence of steric hindrance and absence of an ortho substituent favors a phenolic structure. A unified theory to explain the above is that there is a competition between the reactivity of the aromatic carbon (ortho with respect to the oxygen) and the basic nitrogen atom of the (O—CH$_2$—N(R$_2$)CH$_2$). When substitution on the aromatic ring is in such a way that it reduces the reactivity of the ring ortho carbon, the protonation or alkylation of the nitrogen dominates and a phenoxy structure results. However, if the ortho CH position (with respect to the O) is open and no bulky substituent offers steric hindrance, the ring reactivity dominates and a phenolic structure at low temperatures is the result. In summary, it is anticipated that at −60° C., if i) aromatic ring reactivity dominates, then a phenolic repeating structure is obtained, and if ii) oxazine ring reactivity dominates, then a phenoxy repeating structure is obtained, and that monomers given below will result in an increased probability of the repeating structures given.

| Monomer | Preferred Repeating Structure |
|---|---|
| ![R1, R2 benzoxazine] | Phenolic structure |
| ![R1, R2 benzoxazine] | Phenoxy structure |
| ![R1, R1, R2 benzoxazine] | Phenoxy structure |
| ![R1, R1, R1, R2 benzoxazine] | Mixture phenolic and phenoxy |

As phenolic repeat units from benzoxazine are now available from lower temperature cationic polymerizations, it is desirable to distinguish the resulting polymer from thermally polymerized benzoxazine polymers. Desirably the number average molecular weight of polymers from cationically polymerized monofunctional benzoxazine monomers are at least 2,000 or 5,000. Desirably the cationically polymerized benzoxazine when both phenolic and phenoxy structures result has at least 2, 5, 10, or 15, or at least 50, 80, or 90 mole % repeating units of the phenoxy structures. However, the pure phenolic structure when the molecular weight is above 2,000 or 5,000 is not excluded.

Five benzoxazine monomers were used for most of the experimentation on cationically initiated polymerization. They were BA-a monomer and C-m monomer. Different chemical structures for two of the monomers are shown below:

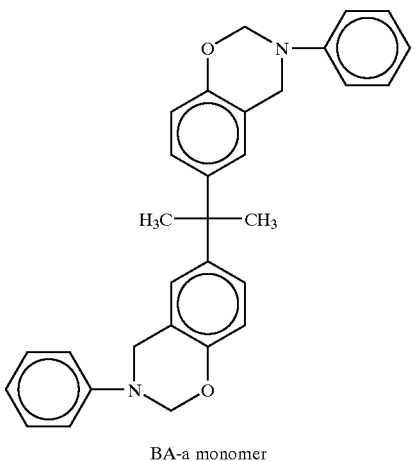

BA-a monomer

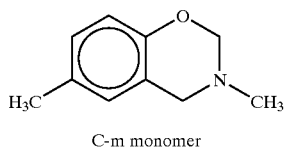

C-m monomer

BA-a monomer is made from the reaction of bisphenol A, formaldehyde, and aniline. C-m monomer is made from the reaction of cresol, formaldehyde, and methylamine. C-m monomer was prepared according to the procedure set forth by Ning and Ishida in Journal of Polymer Science, Chemistry Edition, vol. 32, page 1121 (1994). The polymerization solvents used were 1,2-dichloroethane, 1,2-dichlorobenzene, chloroform, or deuterated chloroform. All the solvents were dried by conventional methods and distilled under argon. The cationic initiators used in Table 1 were purchased from Aldrich Chemical Company and used without further purification. All solvents and reactants were stored in a dry box unless refrigeration was required. The moisture was usually less than 1 ppm in the dry box. Table 1 below shows polymerizations, which were ran for about 20–80 hours using the specified variety of cationic and other initiators. Table 1 sets forth the results of polymerizations of BA-a monomer. While run numbers 8, 9, and 11 did not yield any insoluble polymer, the solutions turned deep red and a tough red polymer was recovered when the solvent was evaporated. The initiator amount was typically about 5 mole percent based upon the amount of benzoxazine monomer:

TABLE 1

| Run No. | Initiator | Temperature | ChCl$_3$ insoluable as wt. % based on total monomer weight |
|---|---|---|---|
| 1 | Phosphorus pentachloride (PCl$_3$) | 20 | 56.2 |
| 2 | Phosphorus trichloride (PCl$_3$) | 20 | 19.6 |
| 3 | Phosphorus oxychloride (POCl$_3$) | 20 | 15.0 |
| 4 | Titanium (V) chloride (TiCl$_5$) | | 19.4 |
| 5 | Triphenylcarbenium antimonatehexachloride [(C$_6$H$_5$)$_3$C+(SbCl$_6$)−] | 20 | 8.7 |

TABLE 1-continued

| Run No. | Initiator | Temperature | ChCl₃ insoluable as wt. % based on total monomer weight |
|---|---|---|---|
| 6 | Antimony pentachloride (SbCl₅) | 53 | 10.1 |
| 7 | Antimony pentachloride/oxetane (SbCl₅) | 20 | 12.3 |
| 8 | Methyl tosylate (MeOTs) | — | — |
| 9 | Methyl triflate (MeOtf) | — | — |
| 10 | Aluminum phthalocynanine chloride (metallophorphyrin) | 20 | 20.4 |
| 11 | Triflic acid | — | — |
| 12 | Borontrifluoro dietherate | 53 | 0 |
| 13 | Borontrifluoro dietherate/promoter | 20 | 0 |
| 14 | p-tolyl triflate | 53 | 0 |
| 15 | Methyl iodide covalent initiator | 53 | 0 |
| 16 | Butyl lithium (anionic) | 20 | 0 |
| 17 | Benzoyl peroxide (free radical) | 110 | 0 |

TABLE 2

| Initiator | Tg by DSC (° C.) | Char yield at 800° C. by TGA (%) |
|---|---|---|
| PCl₅ | 215 | 50.26 |
| PCl₃ | 216 | 48.93 |
| POCl₃ | 210 | 50.53 |
| TiCl₅ | 222 | 61.78 |
| Metallophorphyrin | 186 | 43.59 |
| MeOTf | 193 | 31.48 |
| MeOTs | 142 | 28.06 |
| Triflic acid | — | 31.29 |
| (C₆H₅)₃C⁺(SbCl₆)⁻ | — | — |
| SbCl₅ | — | — |
| Thermal-cured (Cntrl) | 177 | 28.56 |

Several of the polymers polymerized according to the condition set forth in Table 1 were analyzed by thermogravimetric analysis (TGA) or differential scanning calorimity (DSC). The glass transition temperature (Tg) is used to characterize a particular polymer and microstructure. The char yield is affected by many factors, a high char yield is typically desired for precursors for char or for non-flammable polymers. As can be seen in Table 2, the first four cationic initiators yielded polymers from benzoxazine having significantly higher Tg's than the last sample, which was a control (thermally cured) polybenzoxazine from the same monomer. The char yield from the polymers initiated with the first four cationic initiators varied from about 44 or 49 to about 62 weight percent based upon the weight of the initial starting polybenzoxazine. This was significantly higher than the control, which yielded only about 29 weight percent char under identical conditions. The next three cationic initiators (5–7) yielded polymers with slightly different Tg's than the control. The char yield from the fifth through the seventh cationic initiators was also different than that of the control, although the difference from the control amount was not as significant as with the first four cationic initiators. It is to be noted that the polymer from the methyl tosylate, methyl triflate, and triflic acid had a different color (red) than the polymers from the first four cationic initiators.

The polymers from the cationic polymerization of benzoxazine monomer BA-a were analyzed by Fourier transform infrared spectroscopy along with a thermally cured polybenzoxazine from the same monomer. These results indicated substantially similar infrared spectra when bisphenol A-based benzoxazine was used. The polymers compared to the monomer showed the dramatic change in the peaks in the region of 1,000 to 1,350 cm⁻¹, arising from the $CH_2$ wagging (1327 cm⁻¹ and 1305 cm⁻¹), C—O—C asymmetric stretching (1233 cm⁻¹), C—N—C asymmetric stretching (1159 cm⁻¹), and C—O—C symmetric stretching (1031 cm⁻¹) of the oxazine ring, respectively, as well as the decrease of the peak resolution, indicate the opening of the oxazine ring and the polymerization of the monomer into oligomers and polymers.

There are significant spectral differences between the thermally polymerized polybenzoxazine and the PCl₅ initiated polybenzoxazines. In the spectrum of BA-a monomer the peaks centered at 1500 cm⁻¹ and 949 cm⁻¹ are major characteristics of the tri-substituted benzene ring in the benzoxazine structure, corresponding to the in-plane C—C stretching and the out-of-plane C—H deformation of tri-substituted benzene ring, respectively. These two peaks almost disappear in the thermally polymerized polybenzoxazine spectrum, meanwhile a new peak centered at 1489cm⁻¹, representing tetra-substituted benzene ring mode, appears. The results are in accordance with the well-accepted thermal polybenzoxazine structure shown as below:

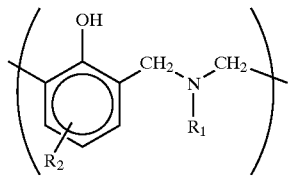

However, with some cationic initiators, here PCl₅ has been chosen as an example, these two peaks at 1500 cm⁻¹ and 949 cm⁻¹ remain unaffected except for the peak broadening, which indicates that in the polybenzoxazine structure obtained, the majority of the benzene rings should still be trisubstituted instead of tetrasubstituted. Further NMR results are in support of this hypothesis.

Polymers for size exclusion chromatographic (SEC) analysis were cationically polymerized from the BA-a monomer using chloroform as a solvent at about 23° C. using PCl₅ initiator and a mole ratio of 1:100 initiator:monomer. Portions of the reactants were withdrawn after 1, 2, 2.5, 3.5, 5, and 7 hours of reactions and poured into an excess of methylol to cause precipitation. The precipitated material was recovered and analyzed by SEC for differences in molecular weight as a function of reaction time. As is well-known in SEC analysis, short retention times indicate higher molecular weight, while long retention times indicate lower molecular weight. A peak at 29.3 minutes was associated with the benzoxazine monomer. A new peak occurred between 21 and 29 minutes as the polymerization occurred. Simultaneously the peak at 29.3 minutes decreased in size. This is consistent with theories on polymerization.

An NMR experiment was conducted comparing polymer from a cationic polymerization, using PCl₅ as the initiator in deuterated chloroform as a solvent, to a thermally polymerized polymer. The reaction temperature for the cationic polymerization was 40° C., the reactor was a sealed NMR tube, and the material was evaluated after 10 minutes, 30 minutes, 1 hour, and 2 hours to see which NMR peaks were being generated or depleted as the monomer was cationically polymerized. The monomer peaks at 2.6, 3.9, and 4.75 ppm gradually disappeared, while new peaks at 1.95 and 3.65 ppm appeared, and a broadening of the peak at 2.2 ppm occurred indicating less molecular rearrangement occurred ongoing from monomer to polymer under cationic conditions. Based on these results (proton NMR) along with carbon [13]NMR and FTIR results, the repeat structure of the thermally polymerized polymer in these studies is theorized to be predominantly tetrasubstituted phenolic structure, e.g.,

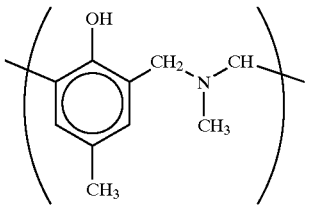

while the cationically polymerized samples is predominantly the phenoxy repeating units of the structure

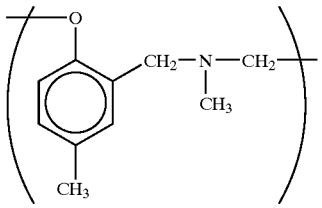

In conclusion, the experimental data indicates the cationically initiated polymerization benzoxazine monomers can occur at substantially lower temperatures than thermal polymerization and produces polymers of different microstructure than thermal polymerizations. Further, these polymers can have substantially higher char yields 62\29 or an increase of 200 percent over the char yield of the thermally polymerized polymers.

The polymers from benzoxazines are useful as precursors for char yielding material (e.g., precursors to aircraft brake pads). They are also useful as temperature and flame resistant polymers for electrical components, planes, cars, buses, etc.

A polybenzoxazine material has the following characteristics, making it desirable as a microelectronic or optoelectronic underfill material:

(i) Low moisture uptake;
(ii) Low volume shrinkage during curing;
(iii) Good film-forming properties (i.e., thickness control and tackiness at room temperature);
(iv) A low coefficient of thermal expansion (CTE).

The following table compares the properties of a typical polybenzoxazine compound with a typical epoxy:

TABLE 3

| Property | Typical Polybenzoxazine-Based Film | Typical Epoxy |
| --- | --- | --- |
| Curing shrinkage (%) | 0 or expansion | 3–4 |
| Moisture uptake (%) | 1.5 | 3 |
| Modulus (GPa) | 4 | 2–3 |
| Tensile strength (MPa) | 130 | 120 |
| Tg (° C.) | 170 | 150 |
| Impact strength (J/m) | 30 | 30 |
| CTE (ppm/° C.) | 55 | 65 |

Figure 1B:
Figure 1C:
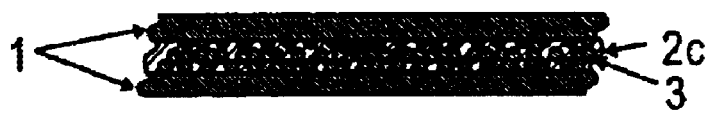
Figure 1D:
Figure 1E:
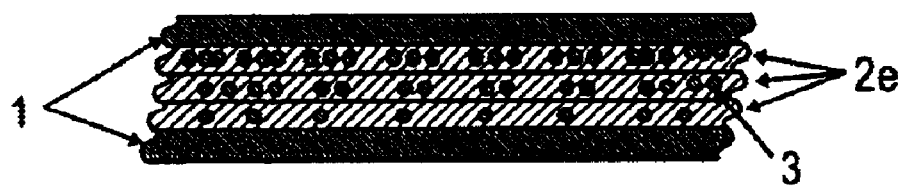

Different film structures can be designed to meet application requirements. Film structures according to embodiments of the invention are shown in FIGS. 1a–1e. In each case, a film 2a–e is provided between two removable sheets 1. FIG. 1a illustrates a film 2a, which is a polybenzoxazine-based film as hereinbefore described. FIG. 1b illustrates a polybenzoxazine-based film 2b including uniformly-dispersed filler particles 4. FIG. 1c illustrates a polybenzoxazine-based film 2c including anisotropic electrically conductive particles 3. FIG. 1d illustrates a polybenzoxazine-based film 2d including electrically conductive columnar components 5. FIG. 1e illustrates a polybenzoxazine-based film having multiple layers 2e with components 3 therein. The components 3 typically have a lower CTE than the polybenzoxazine material of the layers 2e. More of the components 3 are located in an upper one of the films 2e than in lower ones of the films 2e so that the upper film has a lower coefficient of thermal expansion due to the higher number of components 3 than lower ones of the films 2e.

Figure 2A:
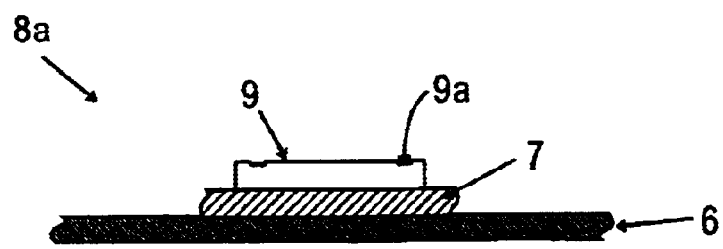
FIGS. 2a–c are cross-sectional side views of electronic assemblies having polybenzoxazine-based underfill materials, according to different embodiments of the invention.

FIG. 2a illustrates an optoelectronic package 8a and an optoelectronic die 9 which is attached to a package substrate 6 by means of an adhesive film 7. The film 7 may, for example, be the film 2a illustrated in FIG. 1a. Film 7 shrinks by a relatively small amount during curing so that the position of the die 9 is substantially maintained relative to the substrate 6. Such a feature is desirable when coupling light from another component, which is at a predetermined distance from the package substrate 6, to a feature 9a on the die 9. A microelectronic package can be assembled n a similar manner by replacing the optoelectronic die in 9 with a microelectronic die.

Figure 2B:
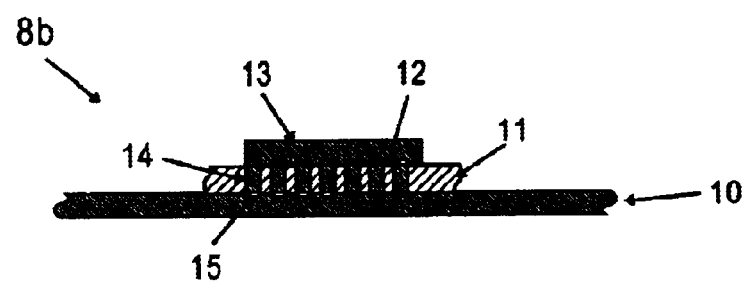

FIG. 2b illustrates an electronic assembly 8b having a semiconductor die 13 attached to a package substrate 10 with a film 11 that may be the same as the film 2d illustrated in FIG. 1d. The film 11 thus includes a plurality of columnar members 14. Each member 14 has an upper end in contact with a respective contact 12 on the die 13, and a lower end in contact with a respective pad 15 of the package substrate 10. The die 13 is in electric communication with the package substrate 10 through the members 14. A lower surface of the die 13 adheres to an upper surface of the material 11, and an upper surface of the package substrate 10 adheres to a lower surface of the material 11. The material 11 electrically insulates the members 14 from one another.

Figure 2C:
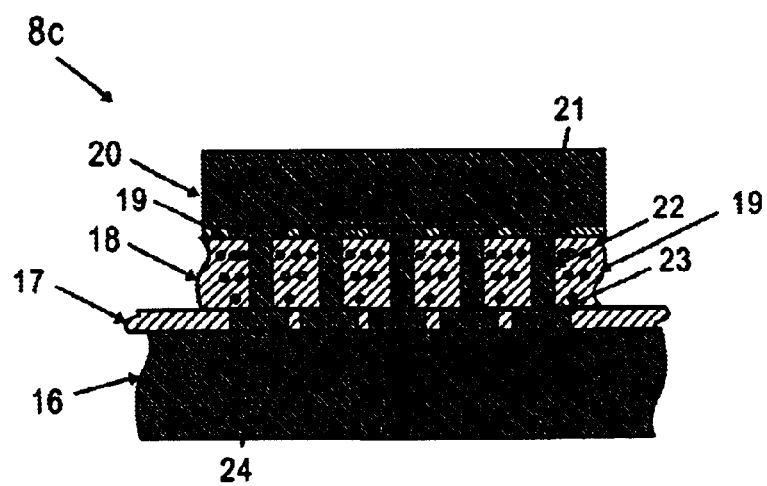

FIG. 2c illustrates an electronic assembly 8c including a semiconductor die 20 which is attached to a package substrate 16 through a film 18. The die 20 has a plurality of contacts 21 on a lower surface thereof, and the package substrate 16 has a plurality of pads 24 on an upper surface thereof. The film 18 includes a polybenzoxazine material 19 having an upper surface attached to a lower surface of the die 20, and a lower surface attached to an upper surface of the package substrate 16. The film also has columnar members 22 in the material 19. Each member 22 establishes an electrical path between a die and its respective substrate, and has a respective upper end contacting a respective one of the contacts 21 and a respective lower end contacting a respective one of the pads 24. The film 18 also has a plurality of filler particles 17 in the material 19. The particles 17 have a lower CTE than the material 19, and thus decrease the overall CTE of the film 18. More of the particles are included near the die 20 than near the package substrate 16, so that the CTE of the film 18 is lower near the die 20 than near the package substrate 16. The die 20 has a lower CTE than the package substrate 16. The CTE of the film 18 closely matches the CTE of the package substrate 16 near the package substrate 16, and closely matches the CTE of the die 20 near the die 20. A similar package can be constructed without columns in the film. It may, for example, be possible to locate the film of FIG. 1e on a substrate having bumps or other contacts thereon, or a substrate without bumps but with bumps on the die. It may also be possible to use the film of FIG. 1e between a die and a substrate where both die and substrate have facing bumps, so that the bumps on both the die and the substrate penetrate the film.

Most of polybenzoxazine-based film monomers are solids at room temperature. But they normally have low melt viscosity at slightly elevated temperatures such as 70–80° C. Cured pure polybenzoxazine-based film materials also have a lower CTE than a typical epoxy material, which allows lower filler loading to reach the same CTE value as a typical epoxy. The low melt viscosity and lower filler loading facilitate the material flow and wet on contact surfaces, and therefore provide a wider process window. Additionally, the lower moisture uptake of the polybenzoxazine-based film material is expected to have better performance of a finished package during moisture testing. There is also a slight volume increase during the cationic ring opening polymerization of the polybenzoxazine material. This volume expansion can effectively reduce residual stresses during the cooling of the entire package.

Considering that polybenzoxazine-based film monomers can be easily made through Mannich reaction from a phenolic derivative, formaldehyde, and a primary amine, it can be seen that a polybenzoxazine-based film can be synthesized from a wide selection of raw materials consisting of phenolic derivatives and primary amines. The molecular structure of polybenzoxazine-based films offers superb design flexibility to allow for the properties of the cured materials to be controlled for the specific requirements of a wide variety of individual applications.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly, comprising:
   a substrate;
   a film adhered to an upper surface of the substrate, the film including a polybenzoxazine polymer and a plurality of columnar members; and
   an electronic die adhered to an upper surface of the film, wherein each columnar member within the film electrically connects a respective contact on the die with a respective pad on the substrate.

2. The electronic assembly of claim 1, wherein the electronic die is one of a semiconductor die and an optoelectric die.

3. The electronic assembly of claim 1, wherein the film includes particles having a different CTE than the polymer.

4. The electronic assembly of claim 3, wherein the particles are substantially uniformly dispersed.

5. The electronic assembly of claim 3, wherein more particles are included in one layer of the film than another layer of the film.

6. The electronic assembly of claim 5, wherein the particles provide the film with a different CTE in one layer than in another layer.

7. The electronic assembly of claim 6, wherein the CTE of the film is lower near the die.

8. The electronic assembly of claim 1, wherein the polymers are derived from the ring opening polymerization of one or more 2H-1,3,-dihydrobenzoxazine monomers.

9. The electronic assembly of claim 8, wherein the one or more 2H-1,3-dihydrobenzoxazine monomers include at least 25 mol % of one or more monomers having the formula

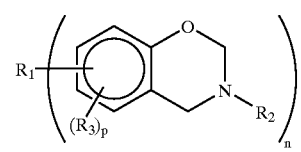

Formula A wherein each $R_1$ individually is one or more groups selected from hydrogen, alkyls of 1 to 10 carbon atoms, aromatic, alkyl substituted aromatic, or aromatic substituted alkyl of 6 to 20 carbon atoms, mono or poly fluorine substituted alkyls of 1 to 20 carbon atoms, mono or poly fluorine substituted compounds having at least one aromatic ring and 6 to 20 carbon atoms or a benzoxazine from a phenolic compound of 6 to 20, n is from 1 to 4;

wherein each $R_2$ is an alkyl of 1 to 10 carbon atoms, an aromatic, alkyl substituted aromatic or aromatic substituted alkyl of 6 to 20 carbon atoms, or an amine of 1 to 10 carbon atoms, or a benzoxazine of 9 to 20 carbon atoms; and wherein $R_3$ and p are as defined above.

10. The electronic assembly of claim 9, wherein the $R_1$ group of the formula A is ortho to the oxygen of the benzoxazine.

11. The electronic assembly of claim 9, wherein the $R_1$ group of the formula A is meta to the oxygen and para to the $CH_2$—N—($R_2$).

12. The electronic assembly of claim 9, wherein the $R_1$ group of formula A is para to the oxygen.

13. The electronic assembly of claim 1, wherein the polymer has a number average molecular weight of at least 5,000.

14. The electronic assembly of claim 1, wherein the polymer is the reaction product of reacting at least one 2H-1,3,-dihydrobenzoxazine monomer with a cationic polymerization initiator.

15. The electronic assembly of claim 14, wherein the cationic polymerization initiator is $PCl_5$.

16. The electronic assembly of claim 14, wherein the 2H-1,3,-dihydrobenzoxa-zine monomer comprises at least 25 mole percent of one or more monomers having the formula Formula A wherein $R_1$ individually is hydrogen, one or more groups selected from alkyls of 1 to 10 carbon atoms, an aromatic, alkyl substituted aromatics, or aromatic substituted alkyls of 6 to 20 carbon atoms, mono or poly fluorine substituted alkyls of 1 to 20 carbon atoms, mono or poly fluorine substituted compounds having at least one aromatic ring and 6 to 20 carbon atoms, or a benzoxazine from a phenolic compound of 6 to 20, n is from 1 to 4;

wherein each $R_2$ is an alkyl of 1 to 10 carbon atoms, an aromatic, alkyl substituted aromatic or aromatic substituted alkyl of 6 to 20 carbon atoms or an amine of 1 to 10 carbon atoms or a benzoxazine of 9 to 20 carbon atoms; and wherein $R_3$ is H or $R_2$ and p is an integer between 0 and 3.

17. The electronic assembly of claim 1, wherein upper ends of the members are coplanar with the upper surface of the film.

18. The electronic assembly of claim 17, wherein lower ends of the members are coplanar with a lower surface of the film.

19. The electronic assembly of claim 18, wherein the members are columnar and have a height being the same as a thickness of the film.

* * * * *

UNITED STATES PATENT AND TRADEMARK OFFICE
CERTIFICATE OF CORRECTION

PATENT NO.   : 6,899,960 B2  
DATED        : May 31, 2005  
INVENTOR(S)  : Shi et al.

It is certified that error appears in the above-identified patent and that said Letters Patent is hereby corrected as shown below:

Column 14,  
Line 3, delete "mol" and insert -- mole --.

Signed and Sealed this

Sixteenth Day of August, 2005

JON W. DUDAS  
*Director of the United States Patent and Trademark Office*